(12) United States Patent
Tseng et al.

(10) Patent No.: US 7,562,235 B2
(45) Date of Patent: Jul. 14, 2009

(54) DUAL POWER SWITCH SYSTEM AND RELATED CONTROL METHOD THEREOF

(75) Inventors: Li-Min Tseng, Taipei (TW); Jen-Hong Larn, Taipei (TW)

(73) Assignee: BenQ Corporation, Taipei (TW)

( * ) Notice: Subject to any disclaimer, the term of this patent is extended or adjusted under 35 U.S.C. 154(b) by 400 days.

(21) Appl. No.: 11/306,409

(22) Filed: Dec. 27, 2005

(65) Prior Publication Data

US 2006/0208576 A1    Sep. 21, 2006

(30) Foreign Application Priority Data

Dec. 31, 2004    (TW) ............................... 93141797 A

(51) Int. Cl.
*G06F 1/00*    (2006.01)
*G06F 1/26*    (2006.01)
*G06F 1/32*    (2006.01)

(52) U.S. Cl. ................... 713/300; 713/320; 396/301; 396/303; 396/349

(58) Field of Classification Search ................ 713/300, 713/320; 396/301, 303, 349
See application file for complete search history.

(56) References Cited

U.S. PATENT DOCUMENTS 6,252,389 B1 *    6/2001    Baba et al. ............. 324/117 H
6,411,068 B1 *    6/2002    Willis ........................ 323/282
6,700,621 B1 *    3/2004    Seo ............................. 348/375
2003/0142228 A1 *    7/2003    Flach et al. ................ 348/335
2005/0052567 A1 *    3/2005    Huang et al. .............. 348/373
2005/0094024 A1 *    5/2005    Sato ........................... 348/360
2006/0056838 A1 *    3/2006    Chen .......................... 396/448

FOREIGN PATENT DOCUMENTS

CN    2174828 Y    8/1994
CN    2751331 Y    1/2006

OTHER PUBLICATIONS

Donald A. Neamen., "Electronic Circuit Analysis and Design.", Aug. 1998, pp. 88-89, Chapter 2, Section 2.4.2, Richard D. Irwin, Tsang Hai Book Publishing Company, Ltd.

* cited by examiner

*Primary Examiner*—Thomas Lee
*Assistant Examiner*—Michael J Brown

(57) ABSTRACT

A dual power switch system and the related control method thereof. The dual power switch system includes: a power supply module for supplying power to the dual power switch system; a first power switch circuit, electrically connected to the power supply module, for generating a first control voltage to trigger the power supply module to supply the power; and a second power switch circuit, electrically connected to the power supply module, for generating a second control voltage through magnetic induction to trigger the power supply module to supply the power.

15 Claims, 4 Drawing Sheets

DUAL POWER SWITCH SYSTEM AND RELATED CONTROL METHOD THEREOF

BACKGROUND OF THE INVENTION

1. Field of the Invention

The present invention relates to a power switch system and a related control method, and more specifically, to a dual power switch system and a related control method.

2. Description of the Prior Art

In recent years, the major reasons for the popularity of digital cameras have been the rapidly-declining prices and increasingly simplified operation methods. The market is highly competitive, so manufacturers need to continuously develop digital cameras with special functions or special exterior designs to attract consumers to purchase their products. A digital camera with a dual power switch can be given as an example.

In addition to an original power switch, the conventional digital camera with the dual power switch utilizes a lens sliding cap mechanism to control the other switch circuit. For example, an elastic wedge is installed on a housing of the digital camera. When moving the lens sliding cap to uncover the lens, the elastic wedge is pressed so that the power supply module of the digital camera is activated to allow the digital camera to start operating. When the lens sliding cap covers the lens again, the elastic wedge will return to its original state and the power supply module is turned off in order to turn off the digital camera. The goal of triggering the power switch can be successfully achieved by using the above mechanism; however, this mechanism affects the exterior design of the digital camera, increases the complexity of the housing mold and increases the production cost.

SUMMARY OF THE INVENTION

One of the objectives of the claimed invention is therefore to provide a dual power switch system and a related control method, in order to solve the above-mentioned problem.

According to the claimed invention, a dual power switch system is disclosed. The dual power switch system comprises: a power supply module for supplying power to the dual power switch system; a first power switch circuit, electrically connected to the power supply module, for generating a first control voltage to trigger the power supply module to supply the power; and a second power switch circuit, electrically connected to the power supply module, for generating a second control voltage through magnetic induction to trigger the power supply module to supply the power.

In addition, the claimed invention provides a control method for a dual power switch system. The control method comprises: (a) supplying power to the dual power switch system; (b) generating a first control voltage to trigger step (a); and (c) generating a second control voltage to trigger step (a) through magnetic induction.

According to the claimed invention, an image capture device is disclosed. The image capture device comprises: a power supply module for supplying power to the image capture device; and a power switch circuit, electrically connected to the power supply module, for generating a control voltage through magnetic induction to trigger the power supply module to supply the power.

The second power switch circuit according to the claimed invention generates a control voltage to control the power supply module through magnetic induction, instead of the related art method in which a conventional digital camera utilizes a sliding mechanism to control a power supply module. In addition, the first power switch circuit and the second power switch circuit according to the claimed invention can independently operate without affecting each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
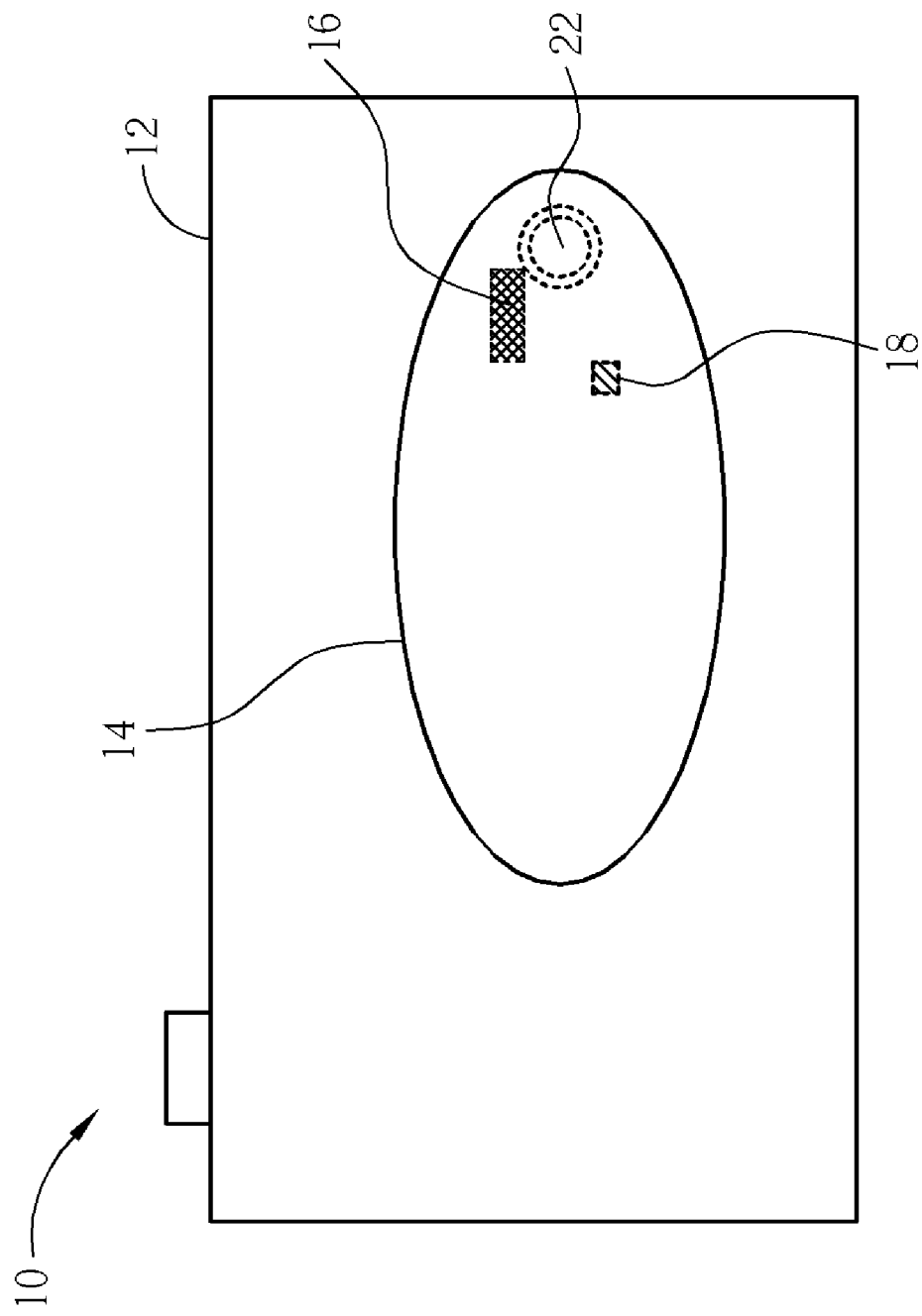
FIG. 1 is an external view diagram of an image capture device with a dual power switch system according to the present invention.

The dual power switch system according to the present invention is simple, so it can be applied to common portable electronic devices, such as digital cameras, mobile phones, or personal digital assistants (PDA) etc. Please refer to FIG. 1. FIG. 1 is an external view diagram of an image capture device 10 with a dual power switch system according to the present invention. The image capture device 10 could be a digital camera, comprising: a housing 12, a sliding lens cap 14, a magnetic component 16, a magnetic induction device 18 and a lens 22. The magnetic component 16 is fixed on the inside of the sliding lens cap 14. Hence, when the sliding lens cap 14 moves, the position of the magnetic component 16 changes accordingly. The description of the operation of the magnetic induction device 18 is included in the following paragraph. The magnetic induction device 18 can be selectively installed on the inside or on the outside of the housing 12. When the sliding lens cap 14 moves towards the left, the magnetic induction device 18 can induct a change of the surrounding magnetic flux and then generate a control voltage. Please notice that the sliding lens cap 14 shown in FIG. 1 is in a "closed" status, which means the lens 22 is covered by the sliding lens cap 14, while the magnetic component 16 is on the right side of the magnetic induction device 18.

Figure 2:
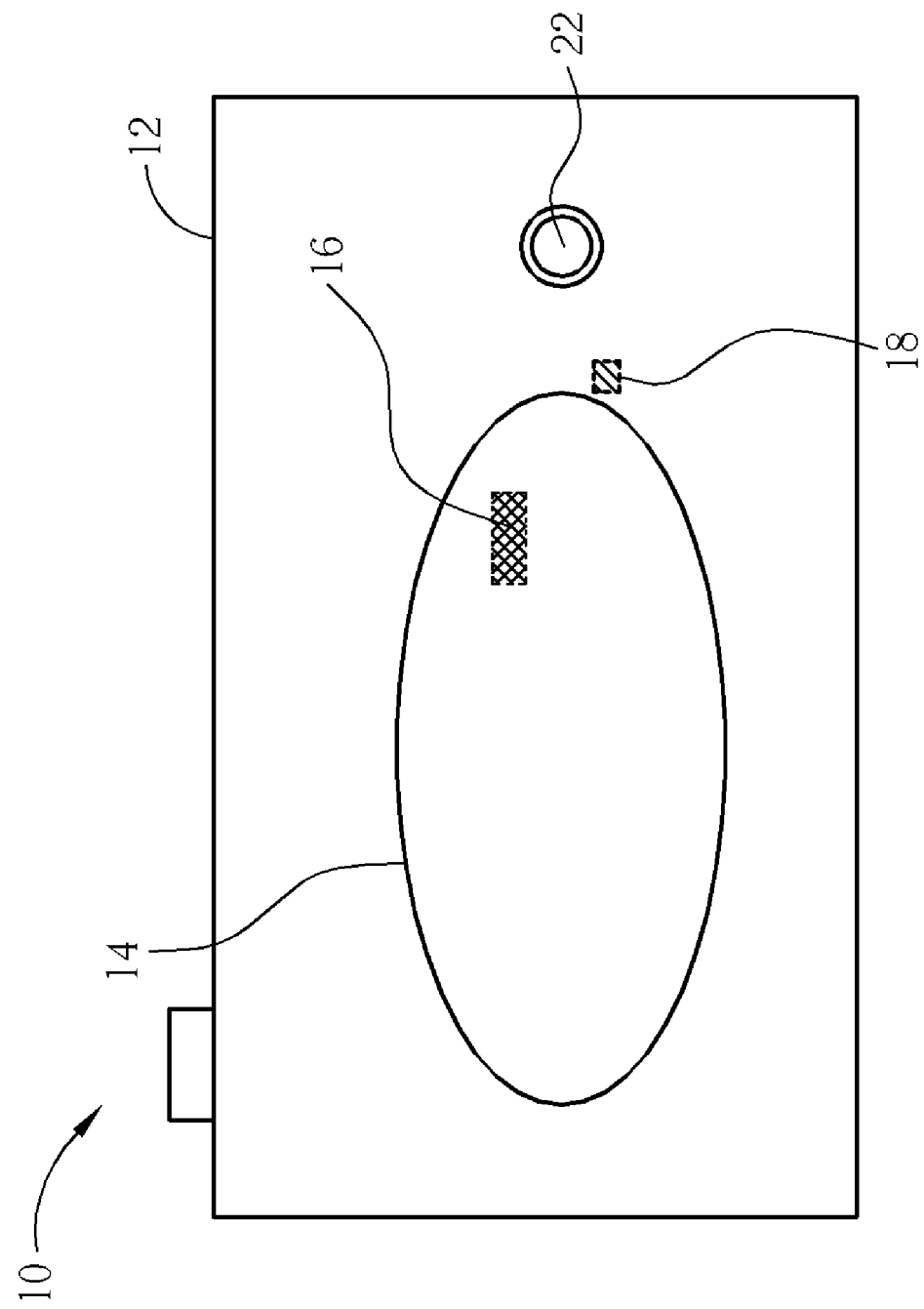
FIG. 2 is a diagram showing an open position of the sliding lens cap of the image capture device shown in FIG. 1.

Please refer to FIG. 2. FIG. 2 is a diagram showing an open position of the sliding lens cap 14 of the image capture device 10 shown in FIG. 1. As shown in FIG. 2, in order to uncover the lens 22, it is necessary to slide the sliding lens cap 14 shown in FIG. 1 towards the left. Therefore, the magnetic component 16 shown in FIG. 2 is on the left side of the magnetic induction device 18. When the sliding lens cap 14 is sliding, the magnetic induction device 18 can detect a magnetic flux change and generate a pulse control voltage according to the amount of magnetic flux in order to control a power switch of the image capture device 10. The detailed description of the related operation is included in the following paragraph.

Figure 3:
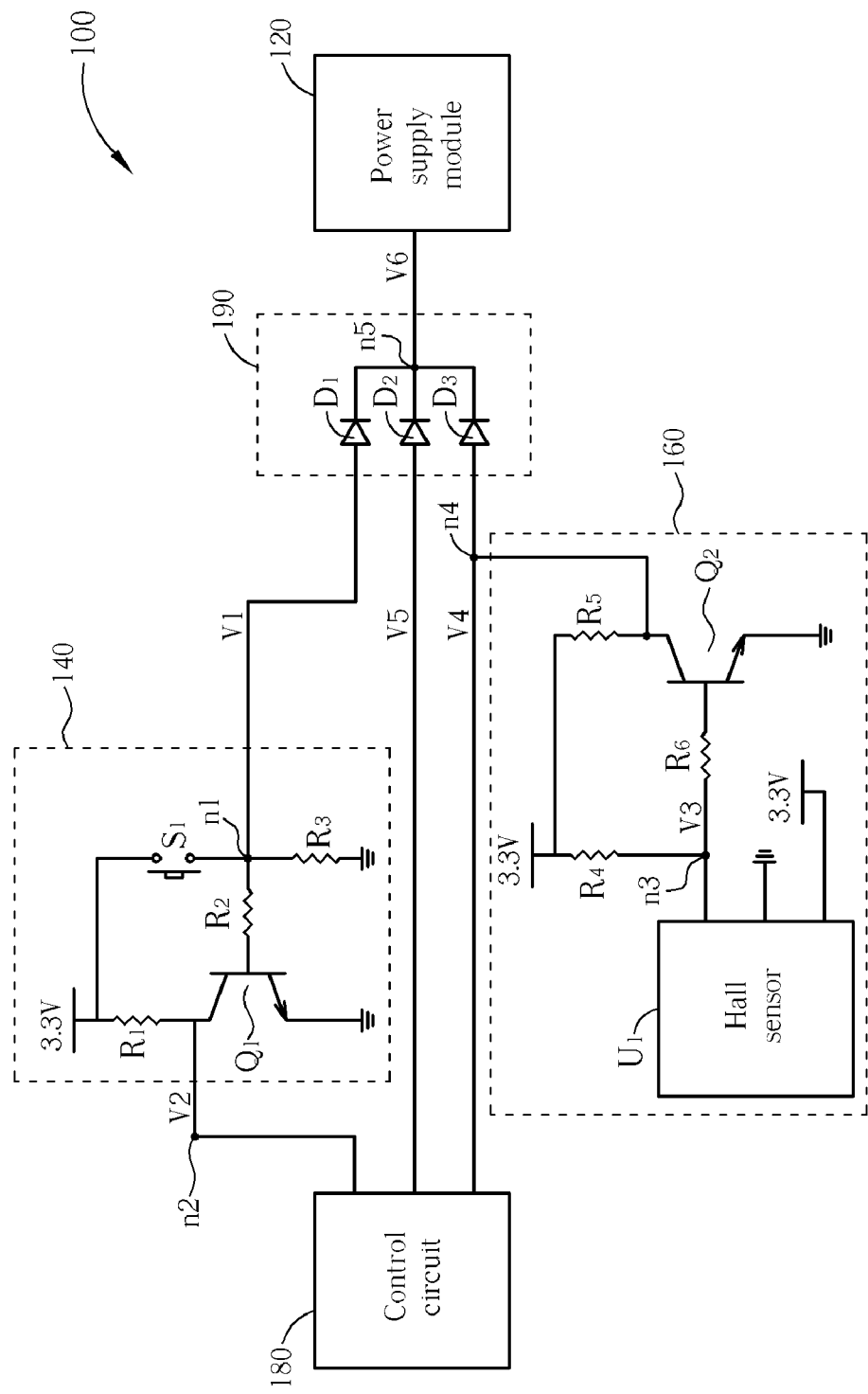
FIG. 3 is a schematic diagram of an embodiment of a dual power switch system according to the present invention.

Please refer to FIG. 3. FIG. 3 is a schematic diagram of an embodiment of a dual power switch system 100 according to the present invention. The dual power switch system 100 comprises a power supply module 120, a button power switch circuit 140, a magnetic induction power switch circuit 160, a control circuit 180 and a logic OR circuit 190. In the present embodiment, the button power switch circuit 140 comprises a button switch S1, a transistor $Q_1$ and a plurality of resistors $R_1$, $R_2$, $R_3$. When a user presses the button switch $S_1$, the button switch $S_1$ temporarily short circuits and generates a control voltage V1 at a high logical level (3.3V shown in FIG. 3) on a terminal n1 and inputs the control voltage V1 into the logic OR circuit 190. At the same time, the transistor Q1 is conductive because the control voltage V1 is at a high logical level, and also generates a control voltage V2 at a low logical level on a terminal n2 (i.e. 0V) to inform the control circuit 180. It should be noted that when the button switch S1 does not short circuit, the control voltage V1 remains at a low logical level, and the control voltage V2 remains at a high logical level. The short circuited status of the button switch $S_1$ is only true for a certain period of time, so a pulse signal is formed in the control voltages V1 when pressing the button switch $S_1$.

In the present embodiment, the magnetic induction power switch circuit 160 comprises a Hall sensor U1 (the magnetic induction device 18 shown in FIG. 1), a transistor $Q_2$, a plurality of resistors $R_4$, $R_5$, $R_6$ and a magnetic sliding cap (not shown). The magnetic sliding cap is the magnetic component 16 and the sliding lens cap 14 shown in FIG. 1. Therefore, no matter whether the magnetic sliding cap is slid open or slid closed, this action causes the Hall sensor U1 to detect a magnetic flux change. When the magnetic flux change is greater than a threshold value, the Hall sensor U1 outputs a control signal V3 at a low logical level on a terminal n3; otherwise the control signal V3 remains at a high logical level. When the sliding lens cap 14 is slid open or slid closed, the amount of the magnetic flux detected by the Hall sensor U1 increases then decreases in a short time. Hence, the control signal V3 will be similar to an upside-down pulse signal. The transistor $Q_2$ then inverses the control signal V3 to generate a control signal V4 and outputs the control signal V4 on a terminal n4 to the logic OR circuit 190 and the control circuit 180. Hence, the control signal V4 presents as a pulse signal.

The logic OR circuit 190 comprises a plurality of diodes, $D_1$, $D_2$, $D_3$, utilized for performing logic or operations on the inputted control voltages V1, V4, V5 so that a control voltage V6 can be generated on a terminal n5 and be sent to the power supply module 120, wherein the control voltage V5 is provided by the control circuit 180. The description of generating the control voltage V5 is included in the following paragraph. When the control voltage V6 corresponds to the high logical level, this situation will drive the power supply module 120 to supply power to the control circuit 180; meanwhile the control circuit 180 can perform the related operations, such as firmware execution. On the other hand, when the control voltage V6 corresponds to the low logical level, the power supply module 120 does not supply power to the control circuit 180 and the control circuit 180 is in a power-off status. Therefore, as long as any one of the control voltages V1, V4, V5 corresponds to the high logical level, the power supply module 120 can be driven to supply power. When all of the control voltages V1, V4, V5 correspond to the low logical level, the power supply module 120 is driven to stop supplying power. Because both of the control voltages V1 and V4 only can remain at the high logical level temporarily, however, it is necessary for the control circuit 180 to generate a stable control voltage V5 further according to the control voltages V2 and V4 to constantly control the power supply module 120.

Figure 4:
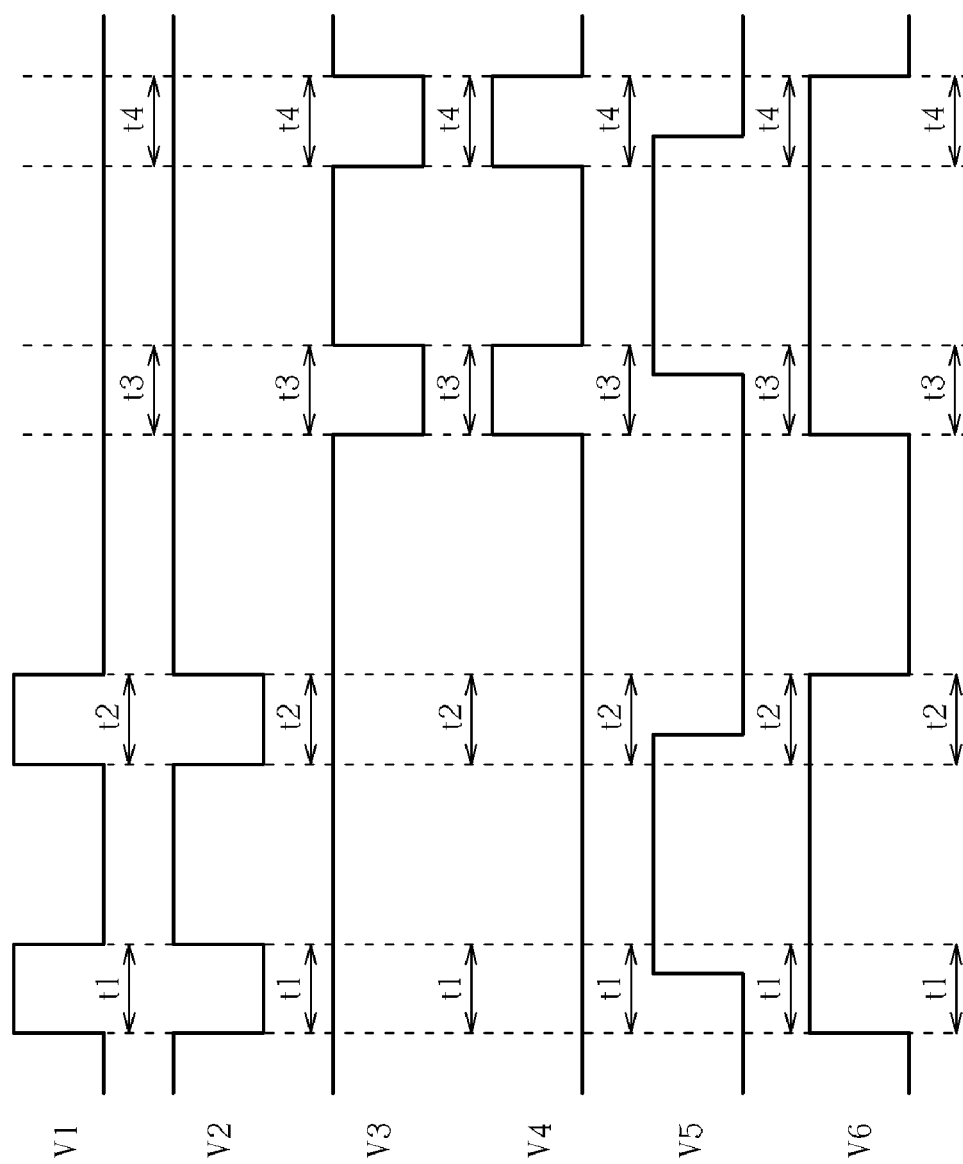
FIG. 4 is a timing diagram of the control voltages V1, V2, V3, V4, V5, and V6.

Please refer to FIG. 3 and FIG. 4. FIG. 4 is a timing diagram of the control voltages V1, V2, V3, V4, V5, V6. In the present embodiment, the control circuit 180 is a microprocessor. After the power supply module 120 starts supplying power to the control circuit 180, the control circuit 180 can operate in a normal condition. When the dual power switch system 100 is in an power-off status, if the user presses the button switch $S_1$ in a time interval t1, the button power switch circuit 140 pulls the control voltage V1 high to generate a pulse signal and send the pulse signal to the power supply module 120, and pulls the control voltage V2 low at the same time. In the present, the control circuit 180 has not finished initialization yet; therefore the control circuit 180 cannot detect the control voltage V2. Also, the power supply module 120 temporarily supplies power to the control circuit 180 because of the pulled-high control voltage V1, allowing the control circuit 180 to start the initialization. After the completion of the initialization of the control circuit 180, the control circuit 180 transmits a control voltage V5 and keeps the control voltage V5 at a high logical level to drive the power supply module 120 to constantly supply power. Therefore, the control circuit 180 can successfully finish booting. It should be noted that when the time interval t1 is ended, the control voltage V1 returns to the low logical level, and the control voltage V2 also returns to the high logical level. Next, if a user presses the button switch $S_1$ again in the time interval t2, the button power switch circuit 140 will pull the control voltage V1 high and pull the control voltage V2 low again. When the control circuit 180 detects that the control voltage V2 is pulled low, it will further pull the control voltage V5 low. Therefore, after the time interval t2 is ended, the control voltages V1, V4, V5 all correspond to the low logical level to allow the power supply module 120 to stop supplying power; meanwhile, the control circuit 180 enters a power-off status.

In the same manner, when the dual power switch system 100 is in a power-off status, if the user slides open the lens cap to uncover the lens in the time interval t3, the magnetic induction power switch circuit 160 pulls the control voltage V3 low and pulls the control voltage V4 high at the same time to generate a pulse signal. Therefore, the control voltage V6 that controls the power supply module 120 increases accordingly to control the power supply module 120 to temporarily supply power to the control circuit 180. When the control circuit 180 completes the initialization, it sends a control voltage V5 and keeps the control voltage V5 at the high logical level to drive the power supply module 120 to constantly supply power. In this way, the control circuit 180 can successfully finish booting. Afterwards, if a user slides close the lens cap to cover the lens in a time interval t4, the magnetic induction power switch circuit 160 will pull the control voltage V3 low and pull the control voltage V4 high. Therefore, when the control circuit 180 detects that the control voltage V4 is pulled high, it will pull the outputted control voltage V5 low. When the time interval t4 is ended, the control voltages V1, V4, V5 all correspond to the low logical level and the power supply module 120 stops supplying power; meanwhile, the control circuit 180 enters a power-off status.

Please refer to FIG. 3. In the present embodiment, the control circuit 180 is a microprocessor, so it can be utilized for recording the open/closed status of the sliding lens cap 14 shown in FIG. 1 to selectively omit the control voltage V4 outputted by the magnetic induction power switch circuit 160. For example, after the user presses the button switch S1, the digital camera will boot. If the control circuit 180 checks the system record and discovers that presently the lens cap is in a closed status, which means the lens is covered by the lens cap, an operation message "Please Uncover the lens" will be displayed on the screen to remind the user. Also, when uncovering the lens, though the control voltage V4 corresponds to a high logical level, the control circuit 180 can recognize that the present change of the control voltage V4 is not because the user needs to turn off the digital camera, and so the control circuit 180 will not change the logical state of the control voltage V5.

In contrast with the related art, the present invention utilizes a Hall sensor to generate a control voltage through magnetic induction to control the power supply module, instead of the related art method in which a conventional digital camera utilizes a sliding cap mechanism to control a power supply module. In this way, manufacturers are provided with more flexibility when designing the appearance of the product; moreover, the production cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual power switch system, comprising:
   a power supply module for supplying power to the dual power switch system;
   a first power switch circuit, electrically connected to the power supply module, for generating a first control voltage to temporarily trigger the power supply module to supply the power, and for generating a third control voltage when generating the first control voltage;
   a second power switch circuit, electrically connected to the power supply module, for generating a second control voltage through magnetic induction to temporarily trigger the power supply module to supply the power; and
   a control circuit receiving power from the power supply module, electrically connected to the first and the second power switch circuits, for generating a fourth control voltage according to the second and the third control voltages to control the power supply module to selectively supply the power.

2. The dual power switch system of claim 1, wherein when the power supply module is supplying the power and the power supply module is triggered by either the first or the second control voltage, the control circuit generates the fourth control voltage to turn off the power supply module; and if the power supply module does not supply the power and the power supply module is triggered by either the first or the second control voltage, the control circuit generates the fourth control voltage to turn on the power supply module.

3. The dual power switch system of claim 2, wherein if one of the first, the second or the fourth control voltages corresponds to a first logical level, the power supply module is capable of supplying the power; and if the first, the second and the fourth control voltages all correspond to a second logical level, the power supply module does not supply the power.

4. The dual power switch system of claim 3, wherein the first and the second logical levels respectively correspond to a high voltage level and a low voltage level, or the first and the second logical levels respectively correspond to a low voltage level and a high voltage level.

5. The dual power switch system of claim 1, wherein the first power switch circuit is a button switch utilized for generating the first control voltage when being pressed, and the first control voltage is a pulse signal.

6. The dual power switch system of claim 1, wherein the second power switch circuit generates the second control voltage when detecting a magnetic flux change, and the second control voltage is a pulse signal.

7. The dual power switch system of claim 6, wherein the second power switch circuit comprises:
   a Hall sensor for generating the second control voltage when detecting the magnetic flux change; and
   a magnetic sliding cap for generating the magnetic flux change when the magnetic sliding cap is moving.

8. The dual power switch system of claim 7, being an image capture device, wherein the magnetic sliding cap is a lens cap of the image capture device.

9. A control method for a dual power switch system, comprising:
   (a) supplying power, from a power supply module, to the dual power switching system;
   (b) generating a first control voltage to temporarily trigger step (a);
   (c) generating a second control voltage to temporarily trigger step (a) through magnetic induction; and
   (d) generating a third control voltage when generating the first control voltage; and
   (e) generating a fourth control voltage according to the second and the third control voltages. generated by a control circuit receiving power from the power supply module, to control whether to start step (a) or not.

10. The control method of claim 9, wherein the step of generating the fourth control voltage comprises:
    If step (a) has been started and one of the second or the third control voltages is generated, the generated fourth control voltage corresponds to stopping step (a);
    If the step (a) has not been started and one of the second or the third control voltages is generated, the generated fourth control voltage corresponds to starting step (a).

11. The control method of claim 10, wherein if one of the first, the second or the fourth control voltages corresponds to a first logical level, step (a) is started; and if the first, the second and the fourth control voltages all correspond to a second logical level, step (a) is stopped.

12. The control method of claim 11, wherein the first and the second logical levels respectively correspond to a high voltage level and a low voltage level, or the first and the second logical levels respectively correspond to a low voltage level and a high voltage level.

13. The control method of claim 9, wherein the first control voltage is generated when a first power switch circuit is pressed, and the first control voltage is a pulse signal.

14. The control method of claim 9, wherein the dual power switch system comprises a magnetic sliding cap, and the second control voltage is generated when a magnetic flux change is generated, and the second control voltage is a pulse signal.

15. The control method of claim 14, wherein the dual power switch system is an image capture device, wherein the magnetic sliding cap is a lens cap of the image capture device.

* * * * *